(12) United States Patent
Lin et al.

(10) Patent No.: US 12,284,784 B2
(45) Date of Patent: Apr. 22, 2025

(54) HOT-SWAPPABLE PUMP UNIT AND COOLANT DISTRIBUTION UNIT USING SAME

(71) Applicant: Delta Electronics, Inc., Taoyuan (TW)

(72) Inventors: Shih-Kang Lin, Taoyuan (TW); Li-Kuang Tan, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 347 days.

(21) Appl. No.: 17/887,669

(22) Filed: Aug. 15, 2022

(65) Prior Publication Data

US 2023/0059922 A1    Feb. 23, 2023

Related U.S. Application Data

(60) Provisional application No. 63/234,880, filed on Aug. 19, 2021.

(30) Foreign Application Priority Data

Jul. 28, 2022 (CN) ......................... 202210897285.8

(51) Int. Cl.
  *H05K 7/20* (2006.01)
  *F04B 53/16* (2006.01)
  *F04B 53/22* (2006.01)

(52) U.S. Cl.
  CPC ......... *H05K 7/20272* (2013.01); *F04B 53/16* (2013.01); *F04B 53/22* (2013.01); *H05K 7/20263* (2013.01); *H05K 7/20772* (2013.01)

(58) Field of Classification Search
  CPC .......... H05K 7/20272; H05K 7/20781; H05K 7/20772
  See application file for complete search history.

(56) References Cited

U.S. PATENT DOCUMENTS

| 6,068,770 A | 5/2000 | Niermeyer et al. |
| 8,655,501 B2 | 2/2014 | Vinson et al. |

(Continued)

FOREIGN PATENT DOCUMENTS

| CN | 112739166 A | 4/2021 |
| CN | 213694655 U | 7/2021 |

(Continued)

*Primary Examiner* — Eric S Ruppert
(74) *Attorney, Agent, or Firm* — KIRTON McCONKIE; Evan R. Witt

(57) ABSTRACT

A hot-swappable pump unit (HSPU) and a coolant distribution unit (CDU) using the same are disclosed. The HSPU is connected to a loop inlet element, a loop outlet element and a fixed component of CDU along a matching direction. The HSPU includes a housing, a pump, a pump inlet element, a pump outlet element and a fastening component. The pump inlet element is in communication with the pump by passing through a first lateral wall of the housing. The pump outlet element is in communication with the pump by passing through the first lateral wall. The fastening component is arranged on the housing and configured to engage with the fixed component, to drive the hosing to move along the matching direction. Whereby, the pump inlet element and the loop outlet element are matched and connected, and the pump outlet element and the loop inlet element are matched and connected.

20 Claims, 17 Drawing Sheets

(56) References Cited

U.S. PATENT DOCUMENTS

| | | | |
|---|---|---|---|
| 11,395,443 B2 † | 7/2022 | Varela Benitez | |
| 2016/0295741 A1 | 10/2016 | Krug et al. | |
| 2020/0178413 A1* | 6/2020 | Thibaut | H05K 7/1452 |
| 2021/0352830 A1* | 11/2021 | Varela Benitez | H05K 7/20272 |
| 2022/0346271 A1* | 10/2022 | Chen | H05K 7/20763 |

FOREIGN PATENT DOCUMENTS

| | | | |
|---|---|---|---|
| JP | H0680275 | * | 11/1994 |
| TW | 200950687 A | | 12/2009 |
| TW | 202117493 A | | 5/2021 |
| TW | 761710 B | | 4/2022 |

\* cited by examiner
† cited by third party

HOT-SWAPPABLE PUMP UNIT AND COOLANT DISTRIBUTION UNIT USING SAME

CROSS REFERENCE TO RELATED APPLICATION

The application claims the benefit of U.S. Provisional Application Ser. No. 63/234,880 entitled "HOT-SWAPPABLE PUMP UNIT" filed Aug. 19, 2021. The subject matter of all of the foregoing disclosure is incorporated herein by reference.

FIELD OF THE INVENTION

The present disclosure relates to a pump unit, and more particularly to a hot-swappable pump unit (HSPU) detachably disposed within a coolant distribution unit (CUD) used to cool the servers of a datacenter for simplifying the maintenance procedures of the hot-swappable pump unit, so that the user is capable of maintaining or replacing the hot-swappable pump unit without shutting down the servers of the datacenter.

BACKGROUND OF THE INVENTION

A datacenter has a structure used to house computer systems and associated components, such as telecommunications and storage system. The interior of the housing structure of the datacenter is a closed accommodation space for containing a plurality of heat generating devices. For cooling, a coolant is delivered to the heat dissipation device attached to the heat generating devices by a coolant distribution unit (CDU) including a pipe set and a pump. In that, the objectives of dissipating heat and cooling down various heat generating devices are achieved.

However, there are many devices received within the housing structure of the datacenter. When the device is disposed in the housing structure of the datacenter and combined with the CDU and the pump of the CDU has to be maintained or replaced, the entire system of the datacenter and the CDU must be shut down, the coolant of the CDU is discharged, and then the device or the pump is taken out for maintenance. Therefore, there are many inconveniences in the maintenance procedures of the pump in the conventional CDU. Especially, in the datacenter, the CDU is combined with the servers for processing data. If the servers need to be shut down for maintaining or replacing the pump of the CDU, it affects the normal data processing of the servers and causes significant losses.

On the other hand, the conventional pump and the corresponding pipe set used in the CDU are complicated. Moreover, the maintenance procedures of the pump are limited by the combination of the pump and the pipe set. It fails to improve the performance and the quality of the maintenance procedures for the pump in CDU.

Therefore, there is a need of providing a hot-swappable pump unit detachably disposed within a coolant distribution unit to cool the servers of the datacenter for simplify the maintenance procedures of the hot-swappable pump unit, and obviating the drawbacks encountered by the prior arts, so that the user is capable of maintaining or replacing the hot-swappable pump unit without shutting down the servers of the datacenter or discharging the coolant of the CDU.

SUMMARY OF THE INVENTION

It is an object of the present disclosure to provide a hot-swappable pump unit (HSPU) detachably disposed within a coolant distribution unit (CDU) used to cool the servers of the datacenter for simplify the maintenance procedures of the hot-swappable pump, so that the user is capable of maintaining or replacing the HSPU without shutting down the servers of the datacenter or discharging the coolant of the CDU. Thus, the performance and the quality of the maintenance procedures are improved effectively.

It is another object of the present disclosure to provide a hot-swappable pump unit used (HSPU) combined within a coolant distribution unit (CDU) used to cool the servers of the datacenter. Since the HSPU is detachably connected to the corresponding coolant loop of the CDU through the quick connectors, the connection and the disassembly of the HSPU and the corresponding coolant loop of the CDU are simplified. When the HSPU disposed within the CDU has to be maintained or replaced, the HSPU can be detached directly without shutting down the servers of the datacenter or discharging the coolant of the CDU. In that, the maintenance procedures of the HSPU are simplified and the user is capable of maintaining the HSPU and the CDU without shutting down the servers of the datacenter or discharging the coolant of the CDU. In addition, when the HSPU is pushed to combine with the CDU along a matching direction, it is necessary to overcome the internal spring force of the quick connectors between the HSPU and the CDU. With a labor-saving mechanism of a first engaging element of a fixed component and a second engaging element of the fastening component provided in the present disclosure, it facilitates the user to push the HSPU to combine with the coolant loop of the CDU through the quick connectors by the engagement of the first engaging element and the second engaging element. On the other hand, in cases of that a centrifugal pump is used in the HSPU, an elbow pipe is connected between the centrifugal pump and the outlet pipe, so that the inlet pipe and the outlet pipe face in the same direction. When the HSPU is pushed along the direction parallel to the inlet pipe and the outlet pipe, the HSPU and the CDU are combined directly through the quick connectors therebetween.

It is a further object of the present disclosure to provide a hot-swappable pump unit used (HSPU) combined within a coolant distribution unit (CDU) used to cool the servers of the datacenter. With a labor-saving mechanism formed by the fixed component and the fastening component, it allows assisting the connection of the quick connectors between the HSPU and the coolant loop of the CDU during the fastening operation, and ensures that the HSPU and the CDU are connected firmly at the same time. Since the fastening component drives the HSPU to connect to the coolant loop of the CDU along the matching direction, through the design of the positioning pin and the positioning aperture, it ensures that the first engaging element of the fixed component and the second engaging element of the fastening component are engaged with each other accurately, so that the HSPU and the coolant loop are connected quickly and stably through the quick connectors therebetween. On the other hand, the electrical connection between the pump of the HSPU and the CDU is implemented and combined with the fastening operation along the matching direction. When the first engaging element of the fixed component and the second engaging element of the fastening component are engaged with each other, the HSPU is driven to connect to the coolant loop through the quick connectors. At the same time, the connection plug of the HSPU is connected to the corresponding connection socket on the CDU to achieve the electrical connection. In this way, the user can simultaneously complete the pipeline communication and the electrical connection between the HSPU and the CDU by performing the fastening operation of the fastening component and the fixed component. Thus, the maintenance of the HSPU is further simplified.

In accordance with one aspect of the present invention, a coolant distribution unit (CDU) is provided and includes a loop inlet element, a loop outlet element, a fixed component and a hot-swappable pump unit (HSPU). The loop inlet element and the loop outlet element are disposed adjacent to each other and in communication with a coolant loop. The hot-swappable pump unit (HSPU) is configured to connect to the coolant loop along a matching direction. The hot-swappable pump unit (HSPU) includes a housing, a pump, a pump inlet element, a pump outlet element and a fastening component. The housing includes an accommodation space and a first lateral wall. The pump is accommodated within the accommodation space. The pump inlet element is in communication with the pump by passing through the first lateral wall and configured to connect to the loop outlet element along the matching direction. The pump outlet element is in communication with the pump by passing through the first lateral wall and configured to connect to the loop inlet element along the matching direction. The fastening component is disposed in the housing and configured to pass through the first lateral wall to engage with the fixed component. When the fastening component and the fixed component are engaged with each other, the housing is driven to move along the matching direction, so that the pump inlet element and the loop outlet element are connected and matched, and the pump outlet element and the loop inlet element are connected and matched.

In accordance with one aspect of the present invention, a hot-swappable pump unit (HSPU) is provided and configured to connect to a loop inlet, a loop outlet and a fixed component of the coolant distribution unit (CDU) along a matching direction. The hot-swappable pump unit (HSPU) includes a housing, a pump, a pump inlet element, a pump outlet element and a fastening component. The housing includes an accommodation space and a first lateral wall. The pump is accommodated within the accommodation space. The pump inlet element is in communication with the pump by passing through the first lateral wall and configured to connect to the loop outlet element along the matching direction. The pump outlet element is in communication with the pump by passing through the first lateral wall and configured to connect to the loop inlet element along the matching direction. The fastening component is disposed in the housing and configured to pass through the first lateral wall to engage with the fixed component. When the fastening component and the fixed component are engaged with each other, the housing is driven to move along the matching direction, so that the pump inlet element and the loop outlet element are connected and matched, and the pump outlet element and the loop inlet element are connected and matched.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
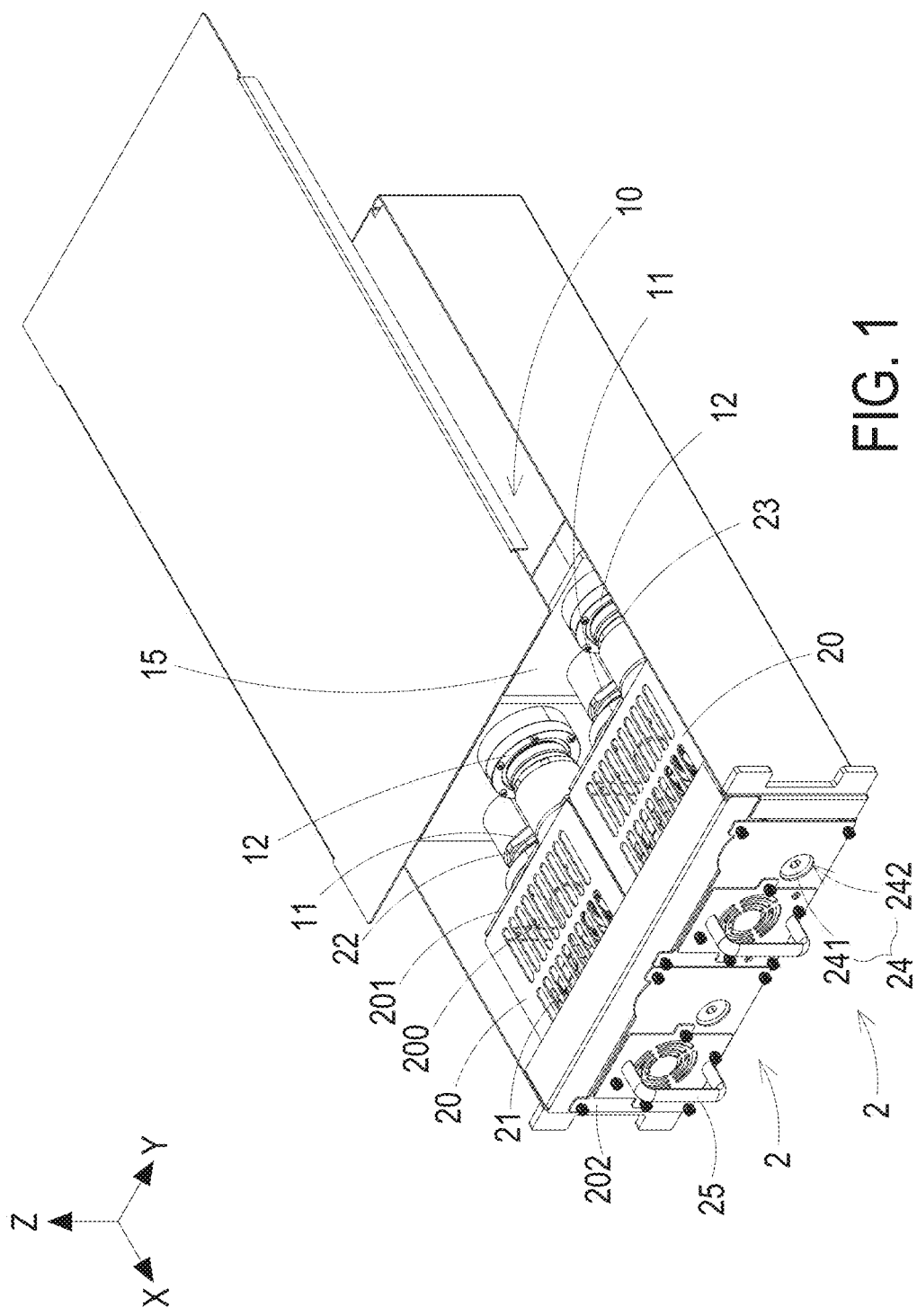
FIG. 1 is a schematic view illustrating a coolant distribution unit combined with two hot-swappable pump unit according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "front", "rear", "upper", "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected", or "coupled", to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Figure 2:
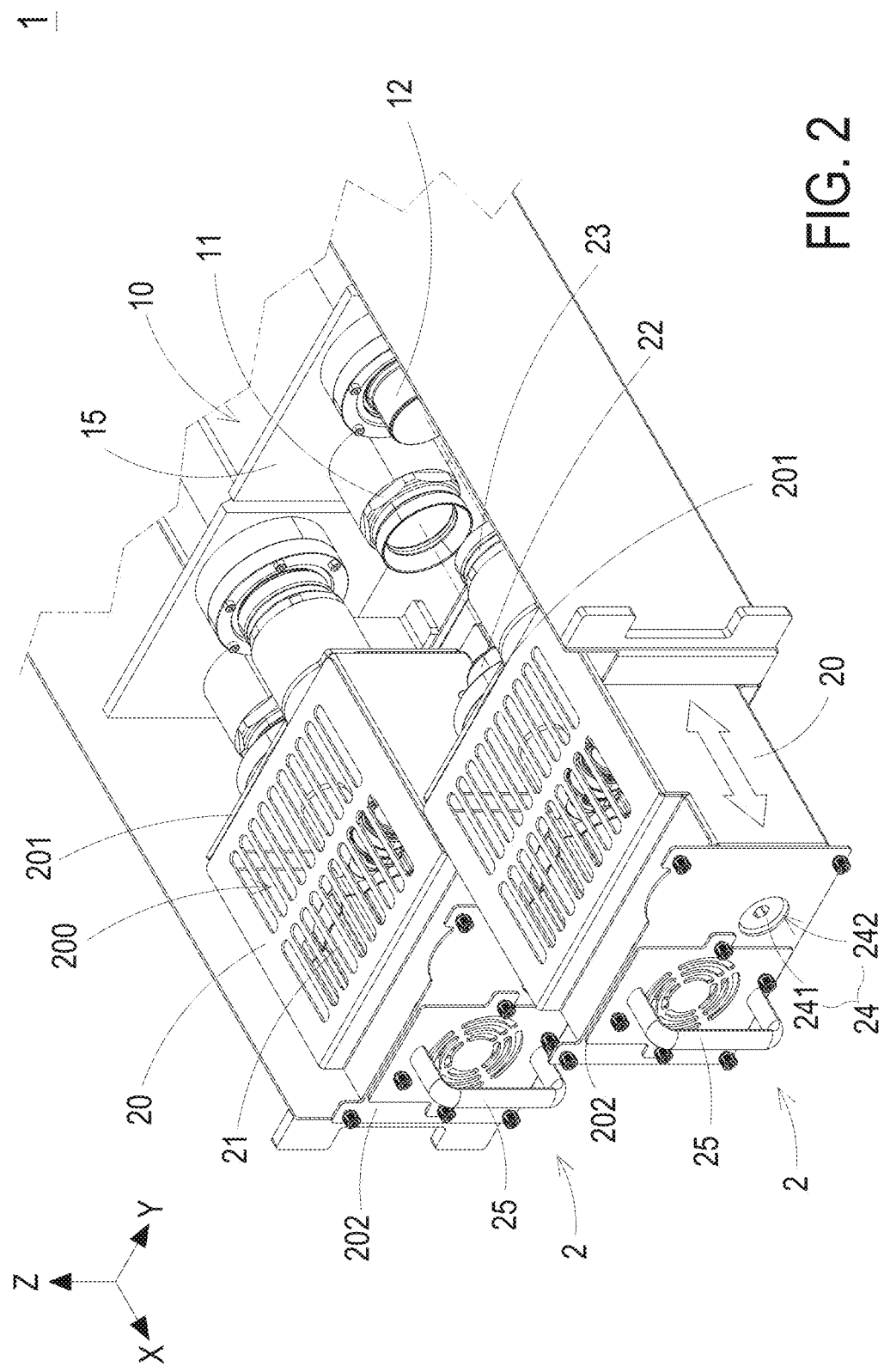
FIG. 2 is a schematic view illustrating the two hot-swappable pump unit detachably connected to the corresponding coolant loop according to the first embodiment of the present disclosure.
Figure 3:
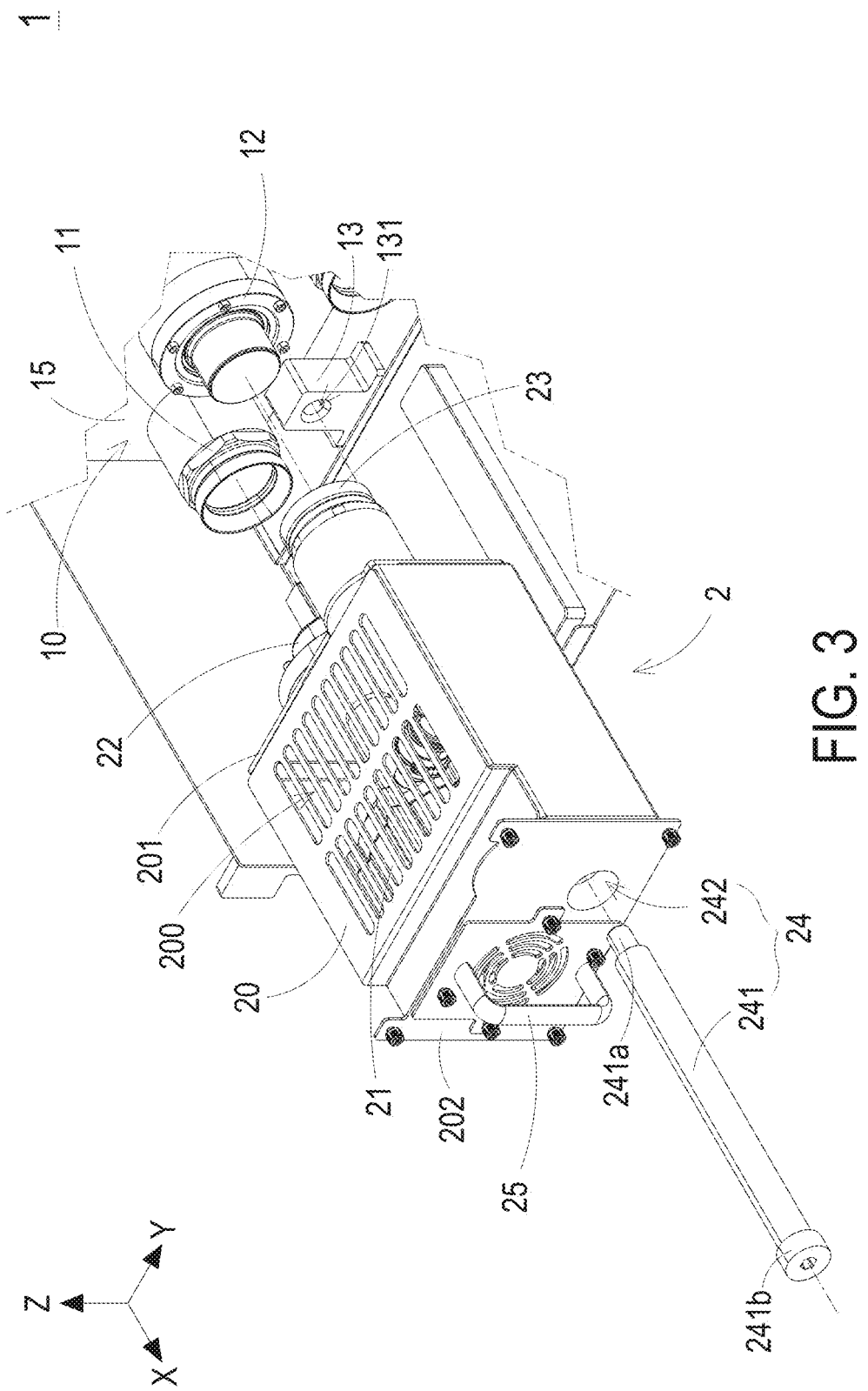
FIG. 3 is a schematic exploded view illustrating the hot-swappable pump unit corresponding to the coolant loop according to the first embodiment of the present disclosure.
Figure 4:
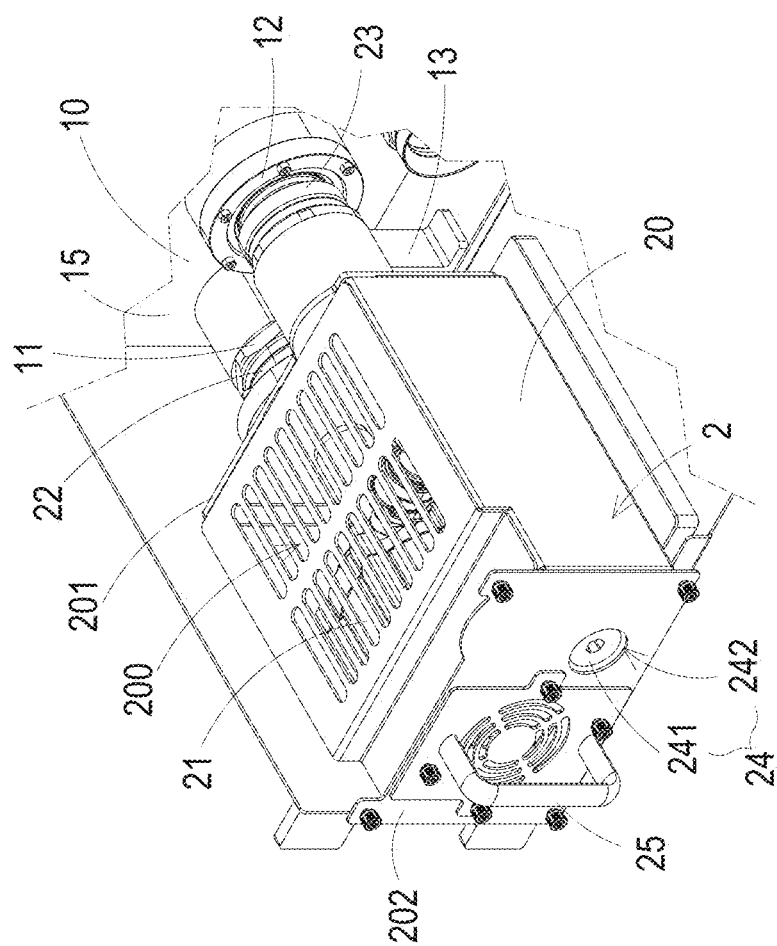
FIG. 4 is a schematic structural view illustrating the hot-swappable pump unit connected to the corresponding coolant loop according to the first embodiment of the present disclosure.
Figure 5:
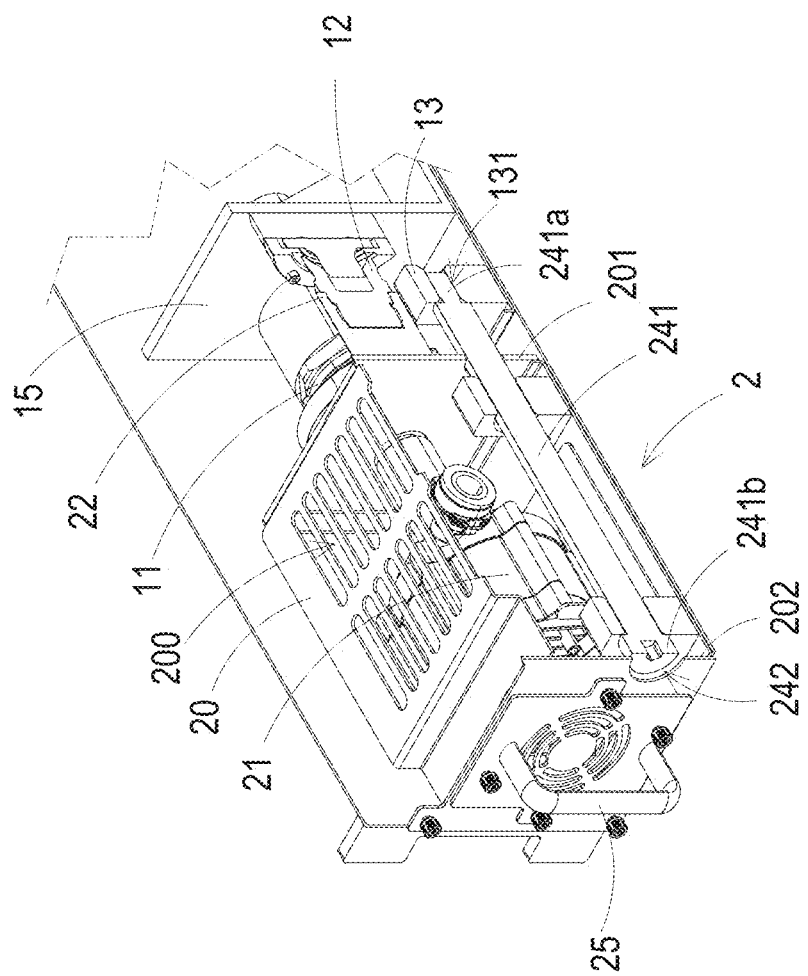
FIG. 5 is a cross-sectional structural view illustrating the hot-swappable pump unit connected to the corresponding coolant loop according to the first embodiment of the present disclosure.

FIG. 1 is a schematic view illustrating a coolant distribution unit combined with two hot-swappable pump unit according to a first embodiment of the present disclosure. FIG. 2 is a schematic view illustrating the two hot-swappable pump unit detachably connected to the corresponding coolant loop according to the first embodiment of the present disclosure. FIG. 3 is a schematic exploded view illustrating the hot-swappable pump unit corresponding to the coolant loop according to the first embodiment of the present disclosure. FIG. 4 is a schematic structural view illustrating the hot-swappable pump unit connected to the corresponding coolant loop according to the first embodiment of the present disclosure. FIG. 5 is a cross-sectional structural view illustrating the hot-swappable pump unit connected to the corresponding coolant loop according to the first embodiment of the present disclosure. In the embodiment, a coolant distribution unit (CDU) 1 provides a coolant loop 10 including the coolant for cooling at least one server (not shown) of a datacenter. The CDU 1 at least includes one hot-swappable pump unit (HSPU) 2 detachably disposed therein. For matching to one HSPU 2, the CDU 1 further includes a loop inlet element 12, a loop outlet element 11 and a fixed component 13, so that it allows to detachably connect the HSPU 2 to the coolant loop 10 of the CDU 1. In the embodiment, the loop inlet element 12 and the loop outlet element 11 are disposed adjacent to each other and in communication with the coolant loop 10, respectively. Preferably but not exclusively, the loop inlet element 12 and the loop outlet element 11 are arranged parallel to the X axial direction. In the embodiment, the HSPU 2 is configured to connect to the coolant loop 10 along a matching direction, such as the reversed X axial direction. When the HSPU is connected to the coolant loop 10, so that the coolant (not shown) is pumped by the HSPU 2 and circulated in the coolant loop 10 smoothly for cooling the server of the datacenter. In the embodiment, the HSPU 2 includes a housing 20, a pump 21, a pump inlet element 22, a pump outlet element 23 and a fastening component 24. The housing 20 includes an accommodation space 200, a first lateral wall 201 and a second lateral wall 202. The first lateral wall 201 and the second lateral wall 202 are opposite to each other in the X axial direction. In addition, the loop inlet element 12 and the loop outlet element 11 are disposed on a backplate 15 opposite to the first lateral wall 201, and the fixed component 13 is arranged between the first lateral wall 201 and the backplate 15. The accommodation space 200 is located between the first lateral wall 201 and the second lateral wall 202, and the pump 21 is accommodated within the accommodation space 200. The pump inlet element 22 is in communication with the pump 21 by passing through the first lateral wall 201, spatially correspond to the loop outlet element 11, and configured to connect to the loop outlet element 11 along the matching direction (i.e., the reversed X axial direction). The pump outlet element 23 is in communication with the pump 21 by passing through the first lateral wall 201, spatially corresponding to the loop inlet element 12, and configured to connect to the loop inlet element 12 along the matching direction (i.e., the reversed X axial direction). The fastening component 24 is disposed in the housing 20 and configured to pass through the first lateral wall 201 to engage with the fixed component 13. When the fastening component 24 and the fixed component 13 are engaged with each other, the housing 20 is driven to move along the matching direction (i.e., the reversed X axial direction), so that the pump inlet element 21 and the loop outlet element 11 are connected and matched, and the pump outlet element 23 and the loop inlet element 12 are connected and matched.

In the embodiment, the pump inlet element 22 and the pump outlet element 23 are disposed adjacent to the first lateral wall 201 and face in the matching direction (i.e., the reversed X axial direction). When the HSPU 2 is detachably connected to the corresponding coolant loop 10 along the matching direction (i.e., the reversed X axial direction), the loop outlet element 11 and the pump inlet element 22 are in fluid communication with each other, and the loop inlet element 12 and the pump outlet element 23 are in fluid communication with each other, so that the coolant contained in the coolant loop 10 is pumped by the pump 21 of the HSPU 2 and circulated in the coolant loop 10 smoothly. In the embodiment, the loop outlet element 11, the loop inlet element 12, the pump inlet element 22 and the pump outlet element 23 are blind-mate quick connectors, respectively. Preferably but not exclusively, the loop outlet element 11 and the pump inlet element 22 are a female connector and a male connector matched to each other. Preferably but not exclusively, the loop inlet element 12 and the pump outlet element 22 are a male connector and a female connector matched to each other. In other embodiment, the loop outlet element 11 and the loop inlet element 12 are male connectors, respectively, and the pump inlet element 22 and the pump outlet element 23 are corresponding female connectors, respectively. The present disclosure is not limited thereto, and not redundantly described hereafter.

On the other hand, the loop inlet element 12 and the loop outlet element 11 face in a detaching direction (i.e., the X axial direction), opposite to the matching direction. When the HSPU 2 detachably connected to the coolant loop 10 is forced to separate away from the coolant loop 10 along the detaching direction (i.e., the X axial direction), the pump inlet element 22 is detached from the loop outlet element 11 so as to be disconnected to each other, and the pump outlet element 23 is detached from the loop inlet element 12, so as to be disconnected to each other. In that, the coolant is kept in the HSPU 2 and the coolant loop 10, and it allows taking out the HSPU 2 directly. The user is capable of maintaining or displacing the HSPU 2 without shutting down the servers of the datacenter or discharging the coolant of the CDU 1. Thus, the performance and the quality of the maintenance procedures are improved effectively. In the embodiment, the second lateral wall 202 faces toward the first lateral wall 201 in the matching direction, and the first lateral wall 201 faces toward the second lateral wall 202 in the detaching direction. Since the HSPU 2 is detachably connected to the corresponding coolant loop 10 of the CDU 1 through the quick connectors of the loop outlet element 11, the loop inlet element 12, the pump inlet element 22 and the pump outlet element 23, the connection and the disassembly of the HSPU 2 and the corresponding coolant loop 10 of the CDU 1 are simplified. When the HSPU 2 disposed within the CDU 1 has to be maintained or replaced, it allows detaching the HSPU 2 directly without shutting down the servers of the datacenter or discharging the coolant of the CDU 1. In that, the maintenance procedures of the HSPU 2 are simplified and the user is capable of maintaining the HSPU 2 and the CDU 1 without shutting down the servers of the datacenter or discharging the coolant of the CDU 1.

Notably, since the loop outlet element 11, the loop inlet element 12, the pump inlet element 22 and the pump outlet element 23 are blind-mate quick connectors, respectively, it has to provide a force to connect or disconnect the HSPU 2 and the coolant loop 10. Especially, when the quick connectors are matched and connected, it is necessary to provide a larger force to overcome the internal spring force of the quick connectors. In the embodiment, the connection of the HSPU 2 and the coolant loop 10 is achieved through the engagement of the fastening component 24 and the fixed component 13. In the embodiment, the fixed component 13 includes a first engaging element 131. Preferably but not exclusively, the first engaging element 131 is a fastening nut. In the embodiment, the fastening component 24 includes a second engaging element 241 and a guiding channel 242. Preferably but not exclusively, the second engaging element 241 is a labor-saving bolt configured to be matched with the first engaging element 131. The second engaging element 214 further includes an engaging portion 241a and an operating portion 241b disposed on two opposite ends of the second engaging element 241. Preferably but not exclusively, the guiding channel 242 is formed by communicating through holes disposed on at least two blocks, and passed through the first lateral wall 201 and the second lateral wall 202 along the matching direction (i.e., the reversed X axial direction). The guiding channel 202 is spatially corresponding to the first engaging element 131. The engaging portion 241a of the second engaging element 241 is configured to pass through the second lateral wall 202, the guiding channel and the first lateral wall 201 sequentially. In other embodiments, the guiding channel 202 includes the openings of the second lateral wall 202 and the first lateral wall 201. Preferably but not exclusively, the guiding channel 202 further includes a third opening 205 of the first lateral wall 201 (Referring to FIG. 7). In the embodiment, the operating portion 241b is exposed to the second lateral wall 202 of the housing 20 for being operated by the user, and the engaging portion 241a is exposed to the first lateral wall 201 of the housing 20. When the engaging portion 241a of the second engaging element 241 passes through the second lateral wall 202, the guiding channel and the first lateral wall 201 sequentially and is engaged with the first engaging element 131, the housing 20 is driven to move along the matching direction (i.e., the reversed X axial direction), so that the pump inlet element 22 and the loop outlet element 11 are connected and matched, and the pump outlet element 12 and the loop inlet element 23 are connected and matched. In other words, a labor-saving mechanism is collaboratively formed by the first engaging element 131 of the fixed component 13 and the second engaging element 241 of the fastening component 24, and it allows to assist the connections of the quick connectors of the loop outlet element 11, the loop inlet element 12, the pump inlet element 22 and the pump outlet element 23 between the HSPU 2 and the coolant loop 10 of the CDU 1 during the fastening operation, and ensures that the HSPU 2 and the coolant loop 10 are connected firmly at the same time.

In addition, when the HSPU 2 has to be detached from the CDU 1, the user operates the operating portion 241b of the second engaging element 241, so that the engaging portion 241a of the second engaging element 241 is disengaged from the first engaging element 131. Thereby, the pump inlet element 22 is detached from the loop outlet element 11, and the pump outlet element 23 is detached from the loop inlet element 12 at the same time. In the embodiment, the HSPU 2 further includes a handle 25 extended along the detaching direction (i.e., the X axial direction) and disposed on the second lateral wall 202 of the housing 20. It allows the user to push or pull the HSPU 2 through the handle, so as to connect or disconnect the HSPU 20 and the coolant loop 10 of the CDU 1. Certainly, the present disclosure is not limited thereto, and not redundantly described hereafter.

Figure 6:
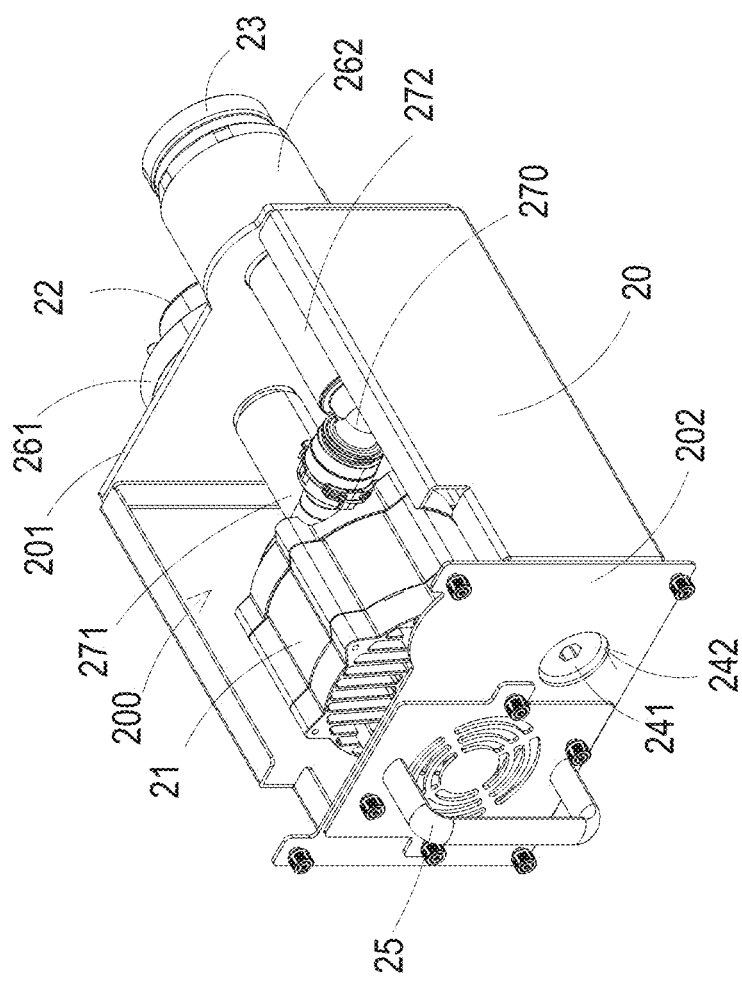
FIG. 6 is a schematic interior view illustrating the hot-swappable pump unit without the top cover according to the first embodiment of the present disclosure.
Figure 6:
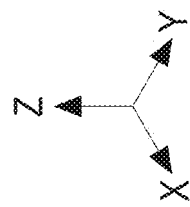
Figure 7:
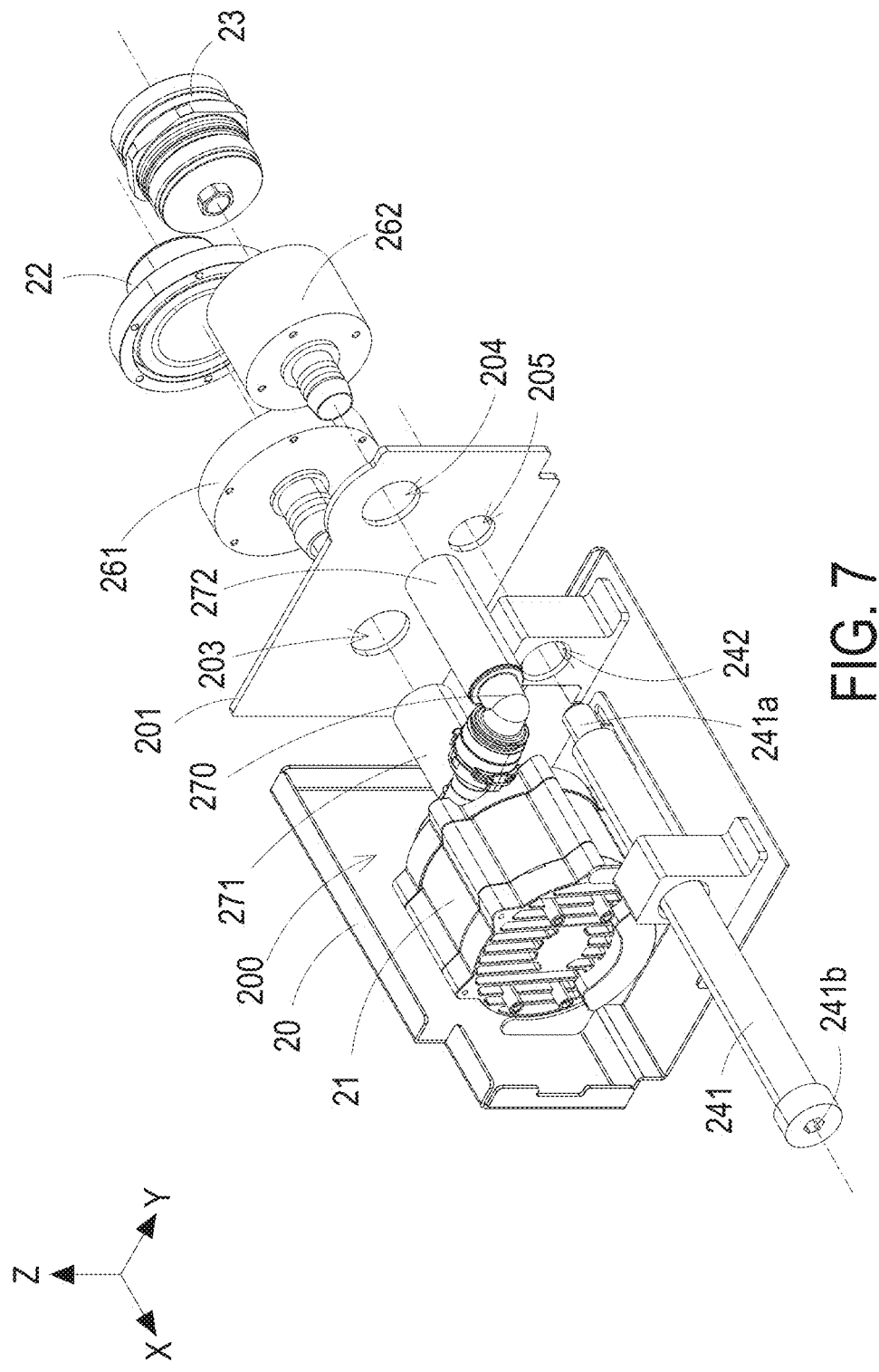
FIG. 7 is a schematic exploded view illustrating the hot-swappable pump unit without the top cover according to the first embodiment of the present disclosure.
Figure 8:
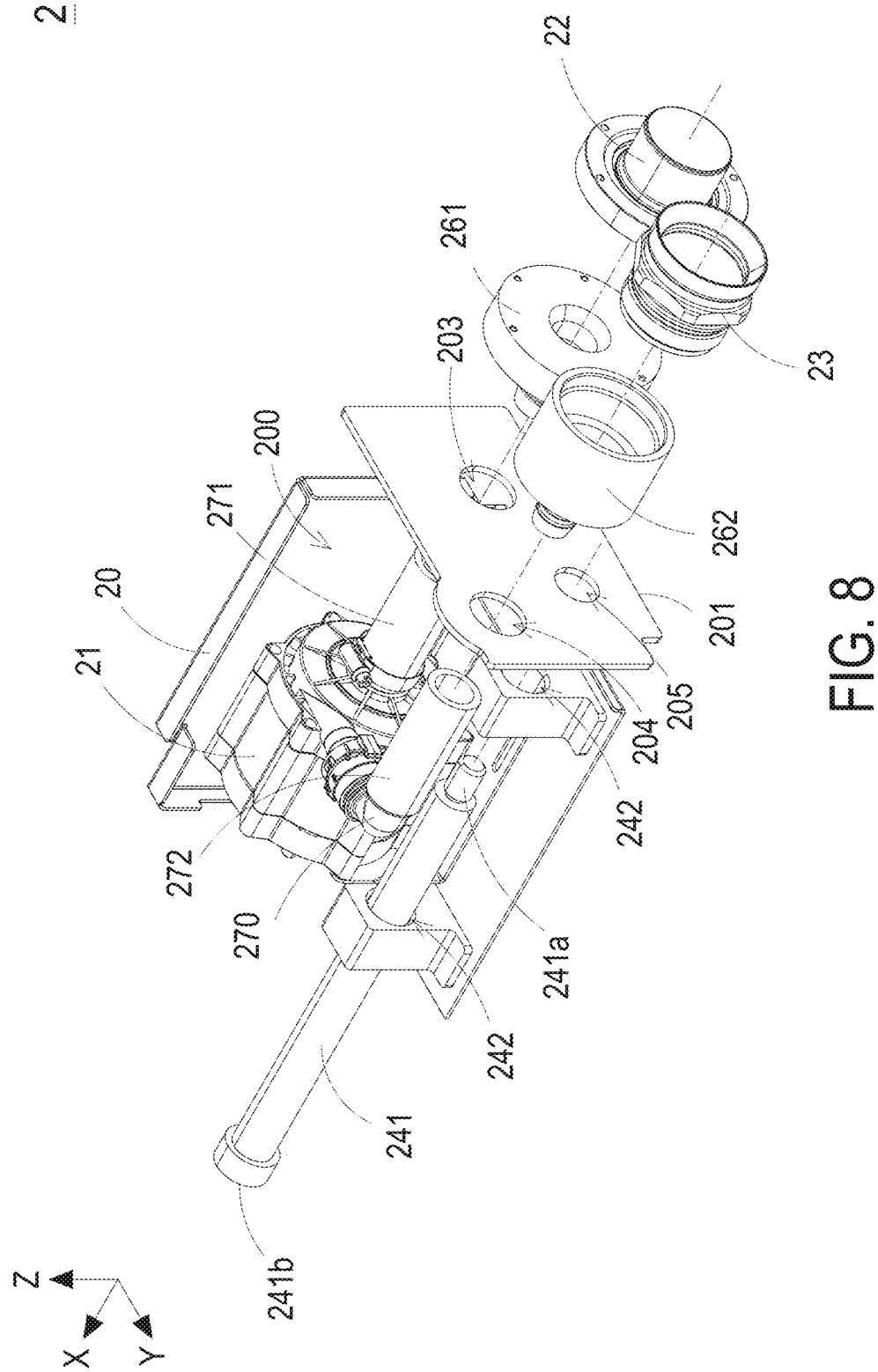
FIG. 8 is a schematic exploded view illustrating the hot-swappable pump unit without the top cover according to the first embodiment of the present disclosure and taken from another perspective.
Figure 9:
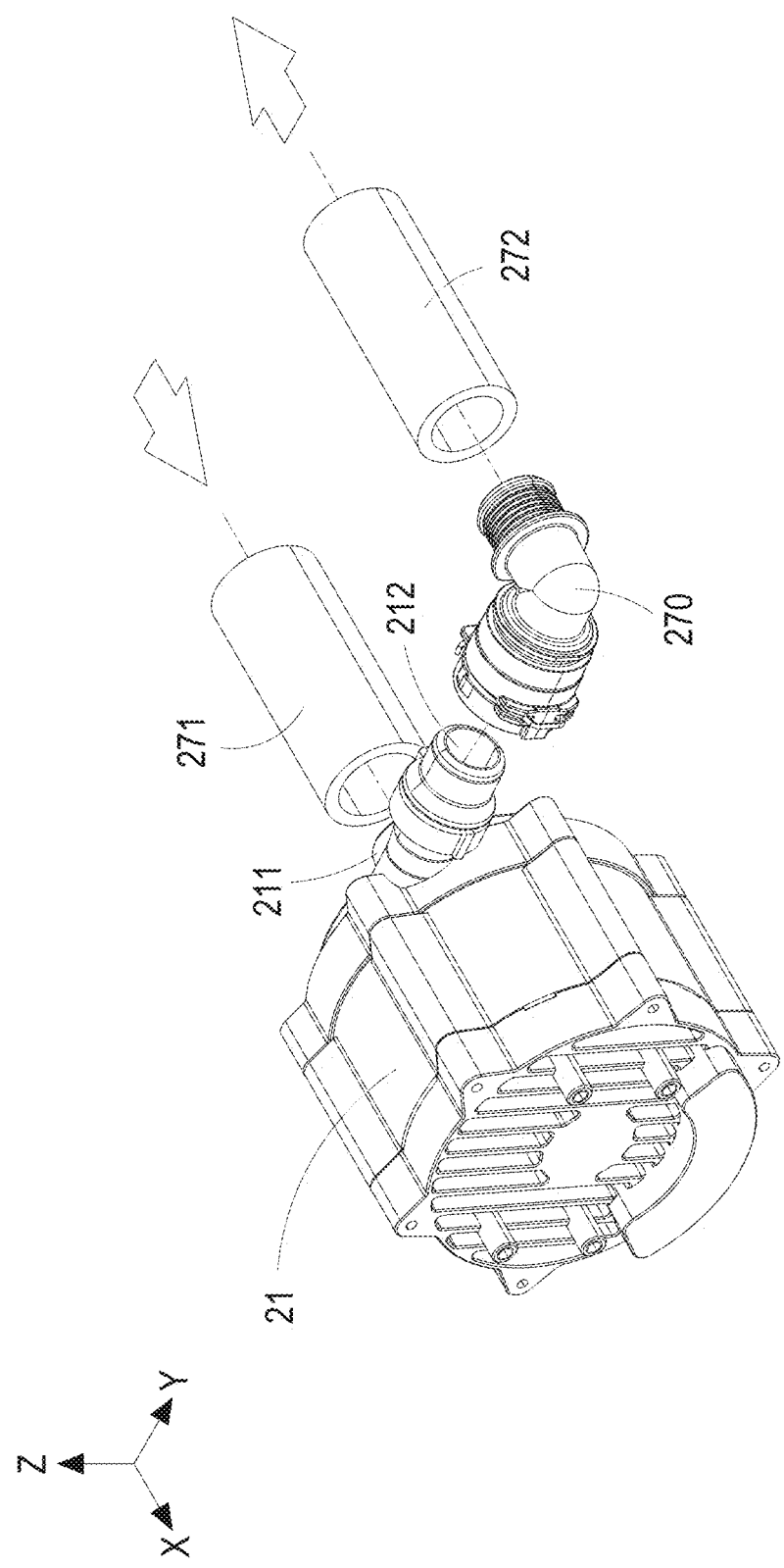
FIG. 9 schematically shows the piping of the centrifugal pump in the hot-swappable pump unit according to the first embodiment of the present disclosure.

FIG. 6 is a schematic interior view illustrating the hot-swappable pump unit without the top cover according to the first embodiment of the present disclosure. FIG. 7 and FIG. 8 are schematic exploded views illustrating the hot-swappable pump unit without the top cover according to the first embodiment of the present disclosure. FIG. 9 schematically shows the piping of the centrifugal pump in the hot-swappable pump unit according to the first embodiment of the present disclosure. Please refer to FIG. 2 to FIG. 9. In the embodiment, the pump 21 of the HSPU2 is for example but not limited to a centrifugal pump, and includes an inlet port 211 and outlet port 212 perpendicular to each other. Preferably but not exclusively, the inlet port 211 faces in the matching direction (i.e., the reversed X-axis direction), and the outlet port 212 faces in the Y axial direction. In the embodiment, the HSPU 2 further includes an inlet adapter 261 and an inlet pipe 271. The pump inlet element 22 is in communication with the inlet port 211 of the pump 21 through the inlet adapter 261 and the inlet pipe 271. The inlet pipe 271 is accommodated in the accommodation space 200, and the inlet adapter 261 is fixed to the first lateral wall 201 and passes through a first opening 203 of the first lateral wall 201 to connect to the inlet pipe 271. Certainly, the present disclosure is not limited thereto. In addition, the HSPU 2 further includes an outlet adapter 262, an outlet pipe 272 and an elbow pipe 270. The pump outlet element 23 is in communication with the outlet port 212 of the pump 21 through the outlet adapter 262, the outlet pipe 272 and the elbow pipe 270. The outlet pipe 272 and the elbow pipe 270 are accommodated in the accommodation space 200, and the outlet adapter 262 is fixed to the first lateral wall 201 and passes through a second opening 202 of the first lateral wall 201 to connect to the outlet pipe 272. Certainly, the present disclosure is not limited thereto.

In the embodiment, the inlet pipe 271 and the outlet pipe 272 are arranged along the X axial direction, and the outlet port 212 of the pump 21 and the outlet pipe 272 are in fluid communication with each other through the elbow pipe 270. Moreover, the pump 21, the elbow pipe 270, the inlet pipe 271 and the outlet pipe 272 are accommodated within the accommodation space 200 of the housing 20. The inlet pipe 271 is connected to and in fluid communication with the pump inlet element 22 through the inlet adapter 261. The outlet pipe 272 is connected to and in fluid communication with the pump outlet element 23 through the outlet adapter 262. Preferably but not exclusively, the inlet adapter 261 and the outlet adapter 262 are fixed to the first lateral wall 201 of the housing 20 by the screws. Notably, the pump inlet element 22, the inlet adapter 261 and the inlet pipe 271 are arranged along the X axial direction, and the pump outlet element 23, the outlet adapter 262 and the outlet pipe 272 are arranged along the X axial direction. When the pump 21 is a centrifugal pump used in the HSPU 2, the pump inlet element 22 and the pump outlet element 23 face in the same direction, and the coolant is transported in the inlet pipe 271, the elbow pipe 270 and the outlet pipe 272, so as to achieve a shorter transportation path. It facilitates the detachable connection between the HSPU 2 and the coolant loop 10 of the CDU 1. Furthermore, when the HSPU 2 is pushed along the direction parallel to the matching direction (i.e., the X axial direction), the HSPU 2 and the coolant loop 10 of the CDU 1 are combined directly through the connection of the loop outlet element 11 and the pump inlet element 22 and the connection of the loop inlet element 12 and the pump outlet element 23. In other embodiment, the elbow pipe 270, the inlet adapter 261 and the outlet adapter 262 are omitted. The pump 21 is in fluid communication with the pump inlet element 21 and the pump outlet element 22 through a pipe set. Certainly, the arrangements of the centrifugal pump 21, the inlet pipe 271, the outlet pipe 272, the elbow pipe 270, the inlet adapter 261 and the outlet adapter 262 are adjustable according to the practical requirements. The present disclosure is not limited thereto and not redundantly described hereafter.

Notably, in the embodiment, the first later wall 201 further includes the third opening 205 spatially corresponding to the first engaging element 131 and the second engaging element 241, so that the engaging portion 241a of the second engaging element 241 is allowed to engage with the first engaging element 131 by passing through the third opening 205. In the embodiment, the third opening 205 is located between the first opening 203 and the second opening 204 in view of an upright direction (i.e., the Z axial direction) of the first lateral wall 201. Namely, the horizontal projection of the third opening 205 is located between the horizontal projection of the first opening 203 and the horizontal projection of the second opening 204. It is beneficial for the engaging force generated by the first engaging element 131 and the second engaging element 241 to evenly drive the pump inlet element 22 and the pump outlet element 23 to abut against the loop outlet element 11 and the loop inlet element 12 of the coolant loop 10. In other words, the first lateral wall 201 includes the first opening 203, the second opening 204 and the third opening 205 facing in the matching direction (i.e., the reversed X axial direction). Moreover, the pump inlet element 22 is in communication with the pump 21 through the first opening 203, the pump outlet element 23 is in communication with the pump 12 through the second opening 204, and the fastening component 24 is connected to the fixed component 13 through the third opening 205. Notably, the third opening 205 is located between the first opening 203 and the second opening 204 in view of an upright direction (i.e., the Z axial direction) of the first lateral wall 201. Thereby, the engaging force generated by the fastening component 24 and the fixed component 13 is evenly distributed to the pump inlet element 22 and the pump outlet element 23, so as to evenly drive the pump inlet element 22 and the pump outlet element 23 to abut against the loop outlet element 11 and the loop inlet element 12 of the coolant loop 10.

Figure 10:
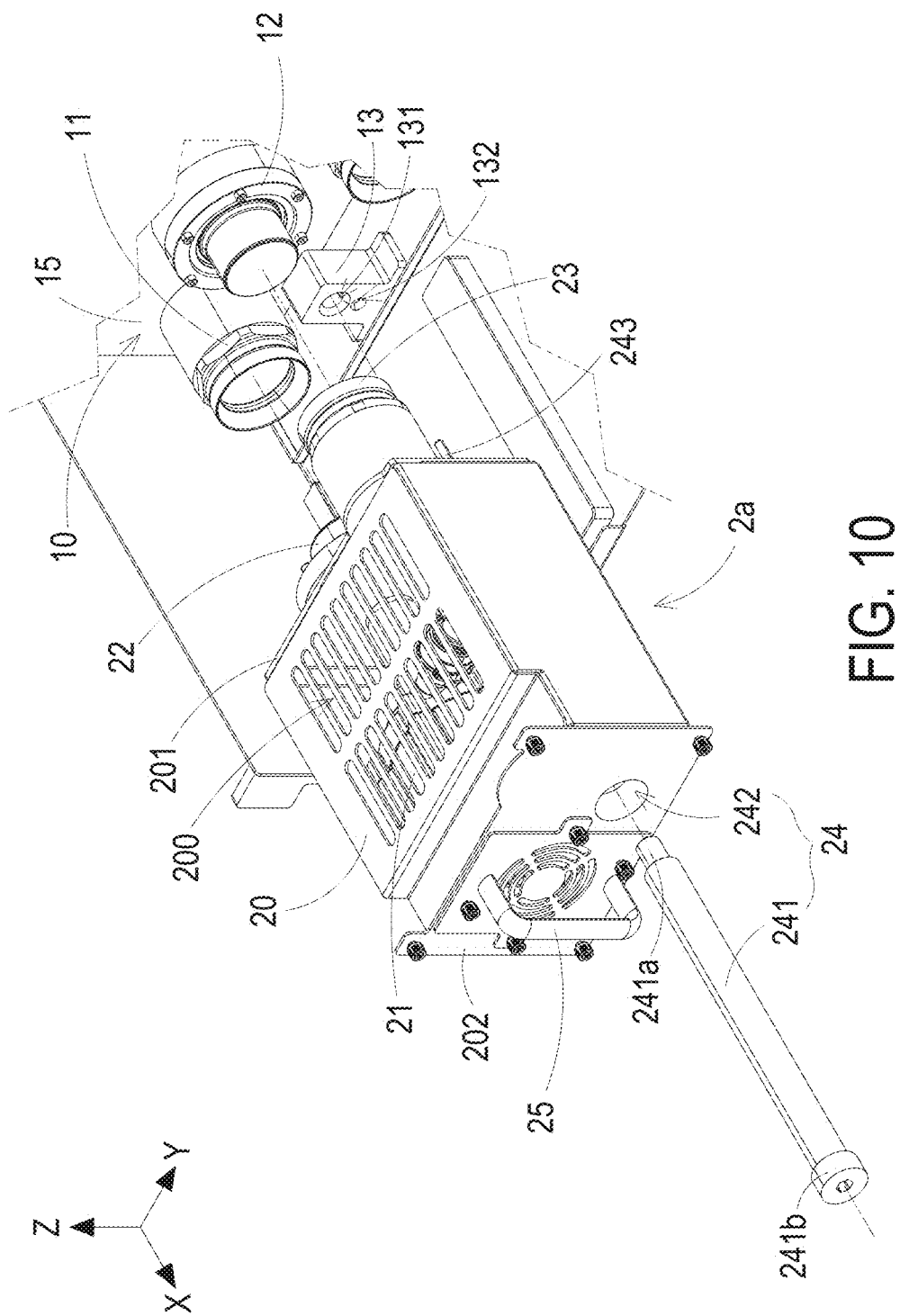
FIG. 10 is a schematic exploded view illustrating a hot-swappable pump unit corresponding to a coolant loop according to a second embodiment of the present disclosure.
Figure 11:
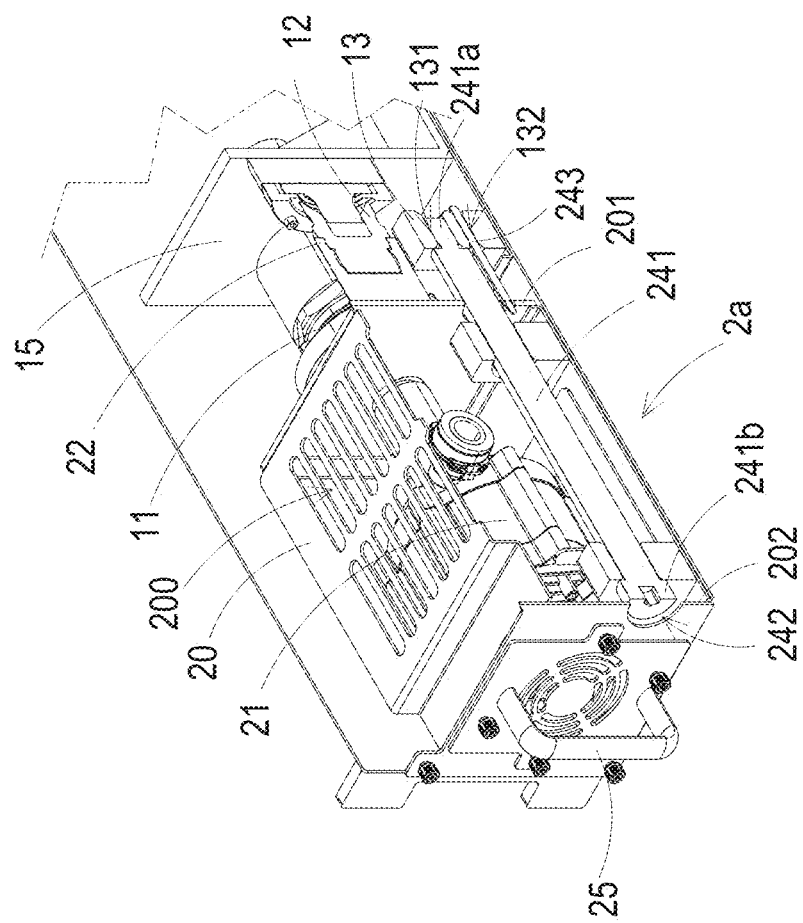
FIG. 11 is a cross-sectional structural view illustrating the hot-swappable pump unit connected to the corresponding coolant loop according to the second embodiment of the present disclosure.
Figure 12:
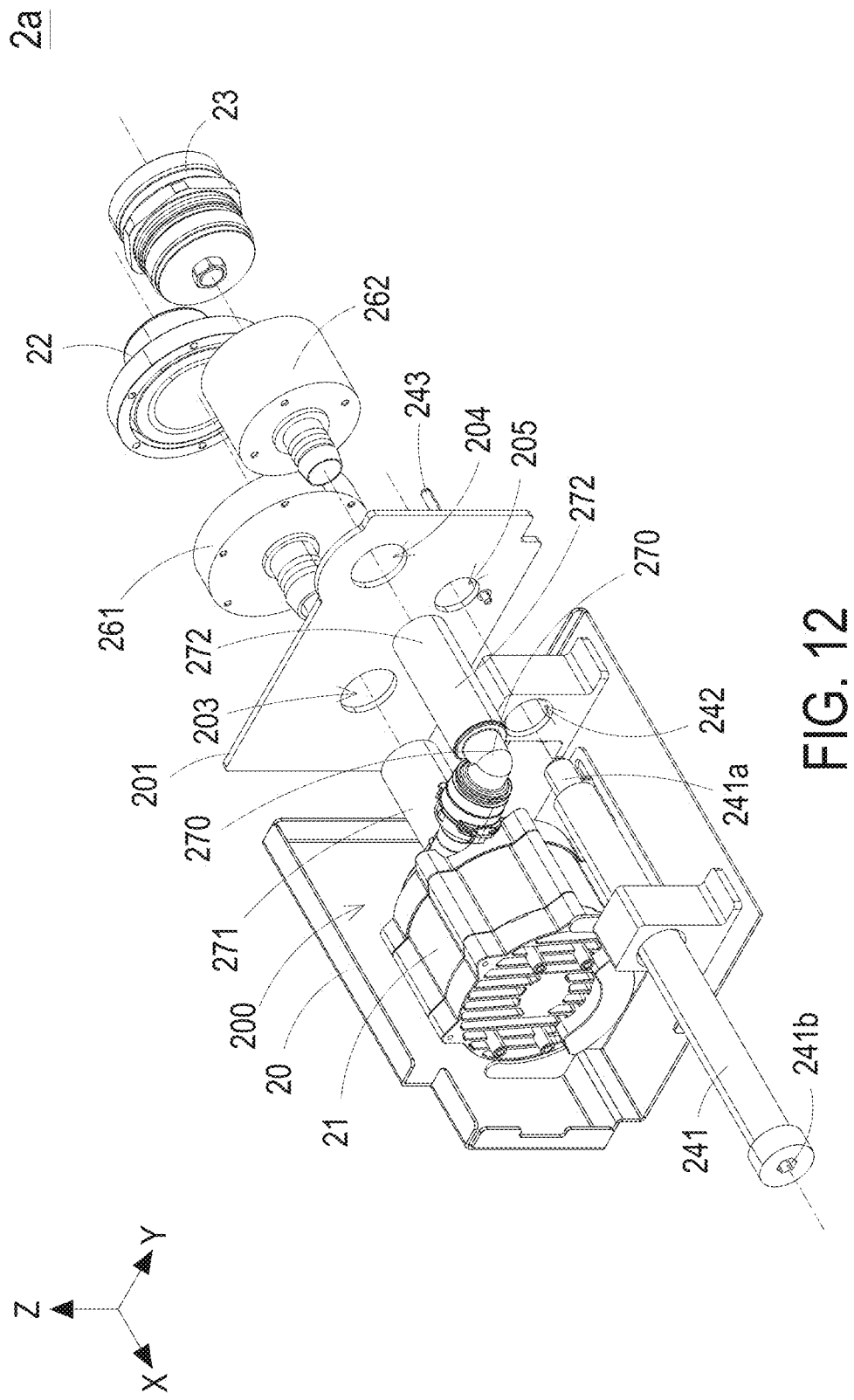
FIG. 12 is a schematic exploded view illustrating the hot-swappable pump unit without the top cover according to the second embodiment of the present disclosure.
Figure 13:
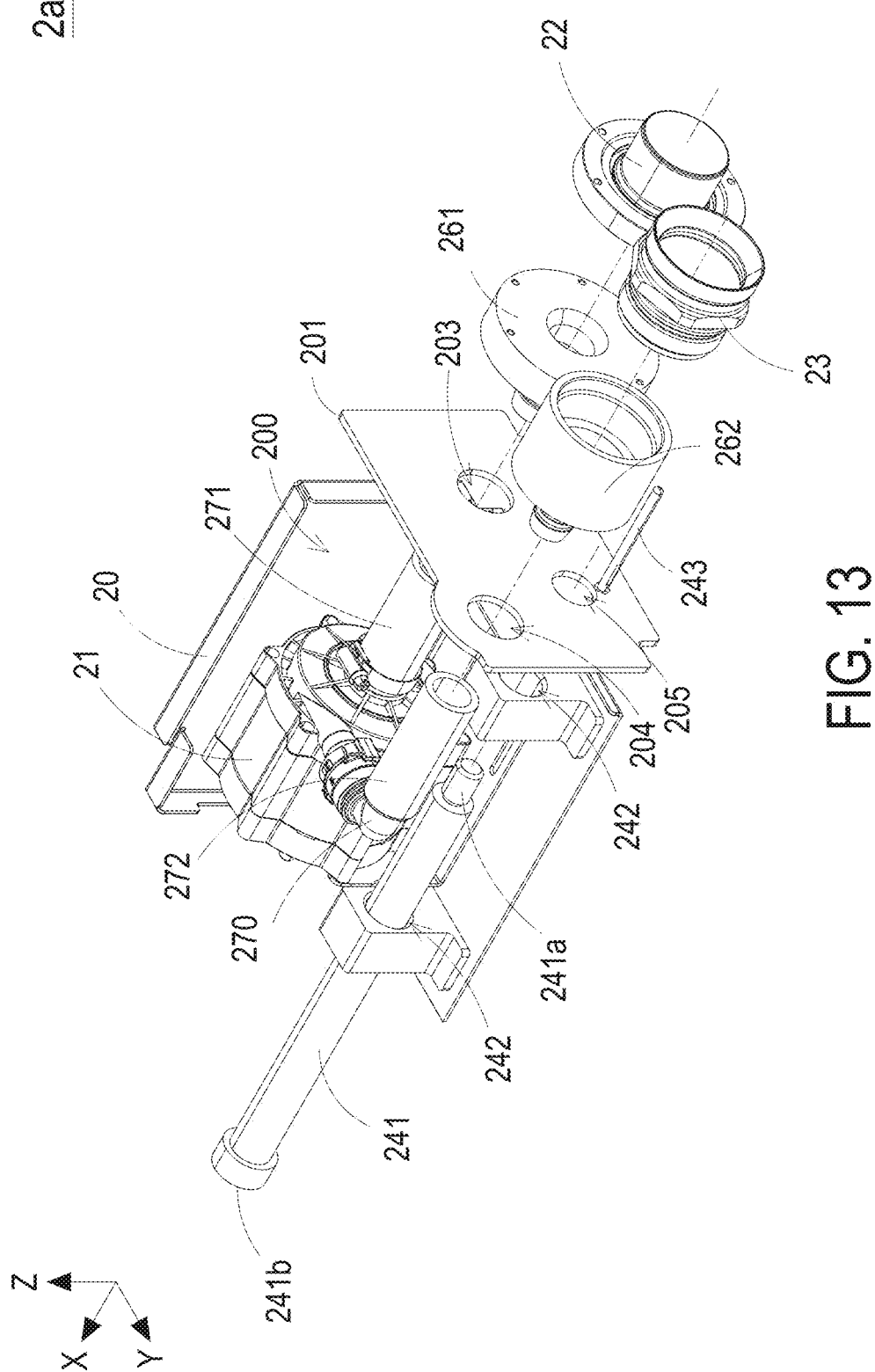
FIG. 13 is a schematic exploded view illustrating the hot-swappable pump unit without the top cover according to the second embodiment of the present disclosure and taken from another perspective.

FIG. 10 is a schematic exploded view illustrating a hot-swappable pump unit corresponding to a coolant loop according to a second embodiment of the present disclosure. FIG. 11 is a cross-sectional structural view illustrating the hot-swappable pump unit connected to the corresponding coolant loop according to the second embodiment of the present disclosure. FIG. 12 and FIG. 13 are schematic exploded views illustrating the hot-swappable pump unit without the top cover according to the second embodiment of the present disclosure. In the embodiment, the structures, elements and functions of the CDU 1a and the HSPU 2a are similar to those of the CDU 1 and the HSPU 2 of FIGS. 1 to 9, and are not redundantly described herein. In the embodiment, the fixed component 13 of the CDU 1a further includes a positioning aperture 132 disposed adjacent to the first engaging element 131. In addition, the HSPU 2a further includes a positioning pin 243 disposed on the first lateral wall 201, extended along the matching direction (i.e., the reversed X axial direction), and spatially corresponding to the positioning aperture 132. In the embodiment, when the positioning pin 243 is aligned to the positioning aperture 132 and passes through the positioning aperture 132, the engaging portion 241a of the second engaging element 241 is allowed to engage with the first engaging element 131 to drive the housing 20 to move along the matching direction (i.e., the reversed X axial direction), so that the pump inlet element 22 and the loop outlet element 11 are connected and matched, and the pump outlet element 23 and the loop inlet element 12 are connected and matched. In other words, since the fastening component 24 drives the HSPU 2a to connect to the coolant loop 10 of the CDU 1a along the matching direction (i.e., the X axial direction), through the design of the positioning pin 243 and the positioning aperture 132, it ensures that the first engaging element 131 of the fixed component 13 and the second engaging element 241 of the fastening component 24 are engaged with each other accurately, so that the HSPU 2a and the coolant loop 10 are connected quickly and stably through the quick connectors therebetween. Certainly, the arrangements of the positioning pin 243 and the positioning aperture 132 are adjustable according to the practical requirements, and the present disclosure is not limited thereto.

Figure 14:
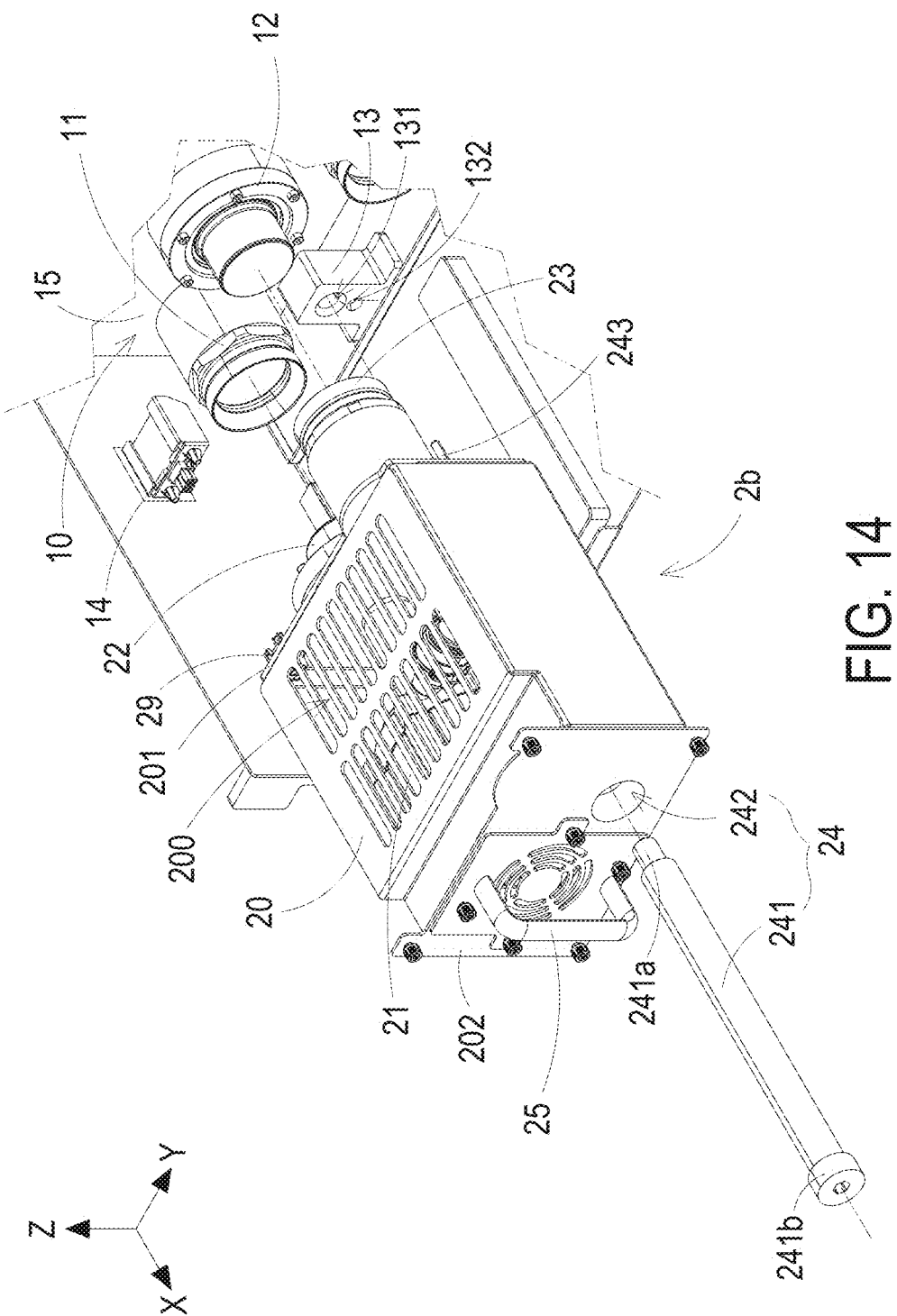
FIG. 14 is a schematic exploded view illustrating a hot-swappable pump unit corresponding to a coolant loop according to a third embodiment of the present disclosure.
Figure 15:
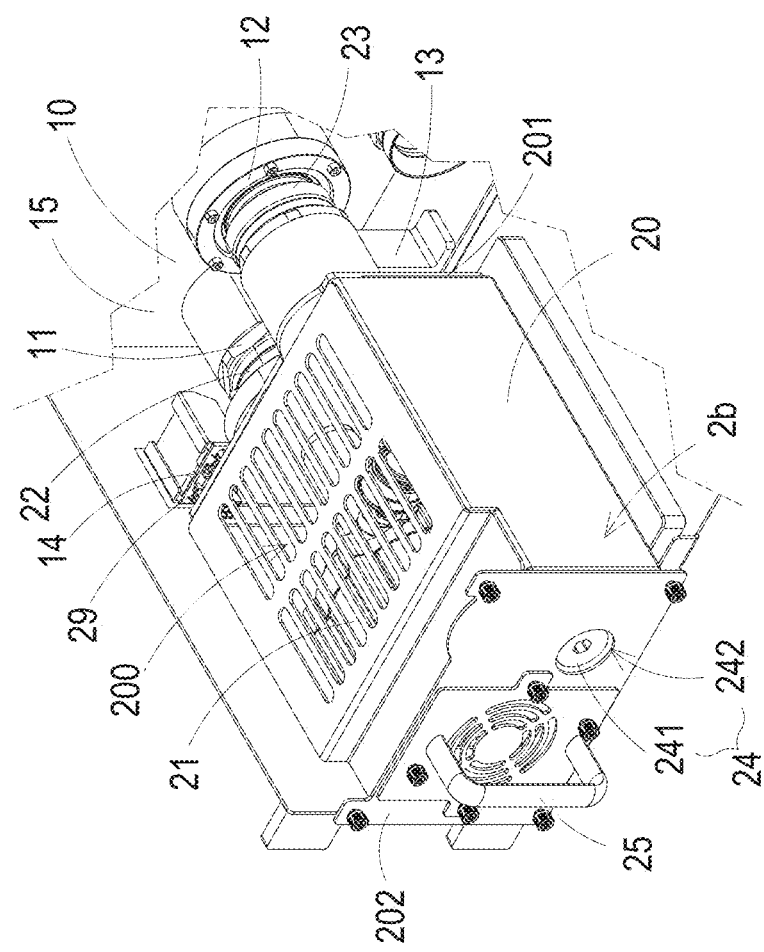
FIG. 15 is a cross-sectional structural view illustrating the hot-swappable pump unit connected to the corresponding coolant loop according to the third embodiment of the present disclosure.
Figure 16:
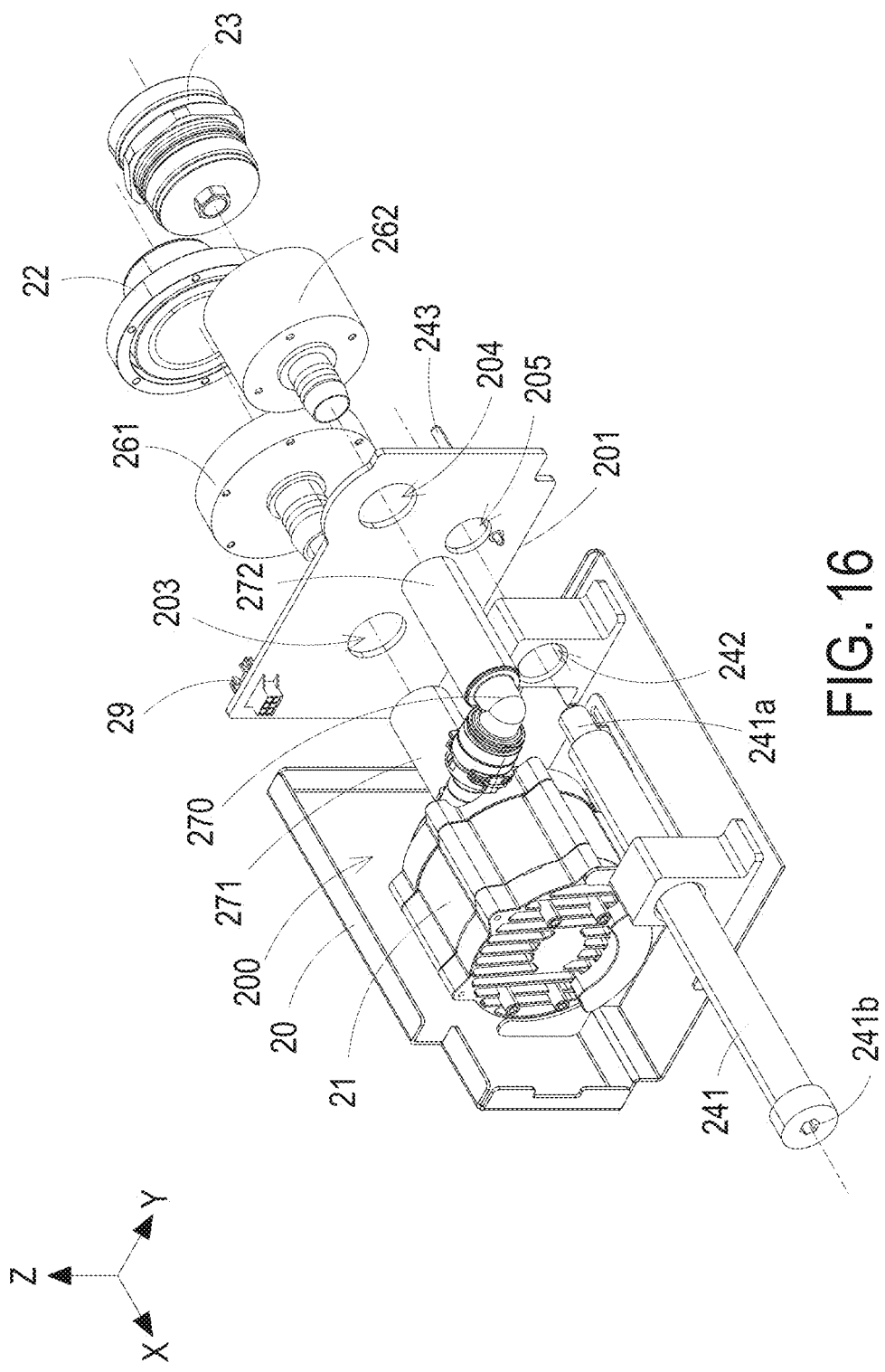
FIG. 16 is a schematic exploded view illustrating the hot-swappable pump unit without the top cover according to the third embodiment of the present disclosure.
Figure 17:
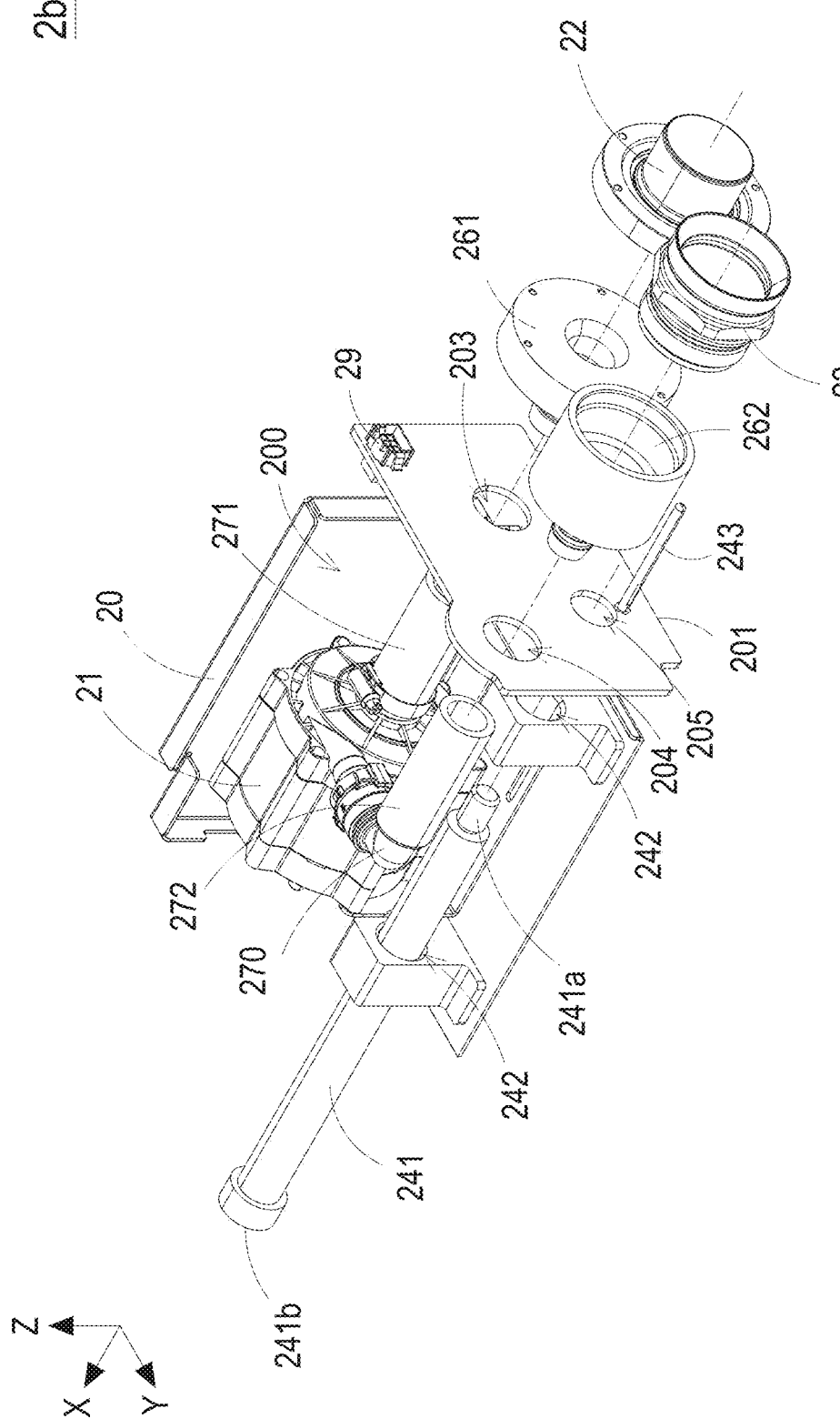
FIG. 17 is a schematic exploded view illustrating the hot-swappable pump unit without the top cover according to the third embodiment of the present disclosure and taken from another perspective.

FIG. 14 is a schematic exploded view illustrating a hot-swappable pump unit corresponding to a coolant loop according to a third embodiment of the present disclosure. FIG. 15 is a cross-sectional structural view illustrating the hot-swappable pump unit connected to the corresponding coolant loop according to the third embodiment of the present disclosure. FIG. 16 and FIG. 17 are schematic exploded views illustrating the hot-swappable pump unit without the top cover according to the third embodiment of the present disclosure. In the embodiment, the structures, elements and functions of the CDU 1b and the HSPU 2b are similar to those of the CDU 1a and the HSPU 2a of FIGS. 10 to 13, and are not redundantly described herein. In the embodiment, the HSPU 2b further includes a connection plug 29 disposed on the first lateral wall 201 and facing in the matching direction (i.e., the reversed X axial direction). In the embodiment, when the first engaging element 131 of the fixed component 13 and the second engaging element 241 of the fastening component 24 are engaged with each other, the displacement of the housing 20 drives the quick connectors to connect to the coolant loop 10, and synchronously drives the connection plug 29 to connect to a connection socket 14 of the CDU 1b to form an electrical connection. In other words, with the connection plug 29 of the HSPU 2a facing in the matching direction, it allows to implement and combine the electrical connection between the pump 21 of the HSPU 2b and the CDU 1b with the fastening operation along the matching direction (i.e., the reversed X axial direction). When the first engaging element 131 of the fixed component 13 and the second engaging element 241 of the fastening component 24 are engaged with each other, the HSPU 2b is driven to connect to the coolant loop 10 through the quick connectors. At the same time, the connection plug 29 of the HSPU 2b is connected to the corresponding connection socket 14 on the CDU 1b to achieve the electrical connection. In this way, the user can simultaneously complete the pipeline communication and the electrical connection between the HSPU 2b and the CDU 1b by performing the fastening operation of the fastening component 24 and the fixed component 13. Thus, the maintenance of the HSPU 2b is further simplified. Certainly, the arrangements of the connection plug 29 and the connection socket 14 are adjustable according to the practical requirements, and the present disclosure is not limited thereto.

In summary, the present disclosure provides a hot-swappable pump unit (HSPU) detachably disposed within a coolant distribution unit (CDU) used to cool the servers of the datacenter for simplify the maintenance procedures of the hot-swappable pump, so that the user is capable of maintaining or replacing the HSPU without shutting down the servers of the datacenter or discharging the coolant of the CDU. Thus, the performance and the quality of the maintenance procedures are improved effectively. Since the HSPU is detachably connected to the corresponding coolant loop of the CDU through the quick connectors, the connection and the disassembly of the HSPU and the corresponding coolant loop of the CDU are simplified. When the HSPU disposed within the CDU has to be maintained or replaced, the HSPU can be detached directly without shutting down the servers of the datacenter or discharging the coolant of the CDU. In that, the maintenance procedures of the HSPU are simplified and the user is capable of maintaining the HSPU and the CDU without shutting down the servers of the datacenter or discharging the coolant of the CDU. In addition, when the HSPU is pushed to combine with the CDU along a matching direction, it is necessary to overcome the internal spring force of the quick connectors between the HSPU and the CDU. With a labor-saving mechanism of a first engaging element of a fixed component and a second engaging element of the fastening component provided in the present disclosure, it facilitates the user to push the HSPU to combine with the coolant loop of the CDU through the quick connectors by the engagement of the first engaging element and the second engaging element. On the other hand, in cases of that a centrifugal pump is used in the HSPU, an elbow pipe is connected between the centrifugal pump and the outlet pipe, so that the inlet pipe and the outlet pipe face in the same direction. When the HSPU is pushed along the matching direction parallel to the inlet pipe and the outlet pipe, the HSPU and the CDU are combined directly through the quick connectors therebetween. With a labor-saving mechanism formed by the fixed component and the fastening component, it allows assisting the connection of the quick connectors between the HSPU and the coolant loop of the CDU during the fastening operation, and ensures that the HSPU and the CDU are connected firmly at the same time. Since the fastening component drives the HSPU to connect to the coolant loop of the CDU along the matching direction, through the design of the positioning pin and the positioning aperture, it ensures that the first engaging element of the fixed component and the second engaging element of the fastening component are engaged with each other accurately, so that the HSPU and the coolant loop are connected quickly and stably through the quick connectors therebetween. On the other hand, the electrical connection between the pump of the HSPU and the CDU is implemented and combined with the fastening operation along the matching direction. When the first engaging element of the fixed component and the second engaging element of the fastening component are engaged with each other, the HSPU is driven to connect to the coolant loop through the quick connectors. At the same time, the connection plug of the HSPU is connected to the corresponding connection socket on the CDU to achieve the electrical connection. In this way, the user can simultaneously complete the pipeline communication and the electrical connection between the HSPU and the CDU by performing the fastening operation of the fastening component and the fixed component. Thus, the maintenance of the HSPU is further simplified.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A coolant distribution unit (CDU), comprising:
   a loop inlet element and a loop outlet element, disposed adjacent to each other and in communication with a coolant loop;
   a fixed component; and
   a hot-swappable pump unit (HSPU) configured to connect to the coolant loop along a matching direction, wherein the hot-swappable pump unit (HSPU) comprises:
   a housing comprising an accommodation space and a first lateral wall, wherein the loop inlet element and the loop outlet element are disposed on a backplate opposite to the first lateral wall, and the fixed component is arranged between the first lateral wall and the backplate;
   a pump accommodated within the accommodation space;
   a pump inlet element in communication with the pump by passing through the first lateral wall and configured to connect to the loop outlet element along the matching direction;
   a pump outlet element in communication with the pump by passing through the first lateral wall and configured to connect to the loop inlet element along the matching direction; and
   a fastening component disposed in the housing and configured to pass through the first lateral wall to engage with the fixed component, wherein when the fastening component and the fixed component are engaged with each other, the housing is driven to move along the matching direction, so that the pump inlet element and the loop outlet element are connected and matched, and the pump outlet element and the loop inlet element are connected and matched.

2. The coolant distribution unit (CDU) according to claim 1, wherein the housing further comprises a second lateral wall opposite to the first lateral wall, the accommodation space is located between the first lateral wall and the second lateral wall, and the pump inlet element and the pump outlet element are disposed adjacent to the first lateral wall and face in the matching direction.

3. The coolant distribution unit (CDU) according to claim 2, wherein the fixed component comprises a first engaging element, the fastening component comprises a second engaging element and a guiding channel, the guiding channel is passed through the first lateral wall and the second lateral wall along the matching direction, and the guiding channel is spatially corresponding to the first engaging element, wherein when the second engaging element passes through the second lateral wall, the guiding channel and the first lateral wall sequentially and is engaged with the first engaging element, the housing is driven to move along the matching direction, so that the pump inlet element and the loop outlet element are connected and matched, and the pump outlet element and the loop inlet element are connected and matched.

4. The coolant distribution unit (CDU) according to claim 3, wherein the fixed component comprises a positioning aperture disposed adjacent to the first engaging element, and the hot-swappable pump unit (HSPU) further comprises a positioning pin disposed on the first lateral wall, extended along the matching direction, and spatially corresponding to the positioning aperture, wherein when the positioning pin is aligned to the positioning aperture and passes through the positioning aperture, the second engaging element is allowed to engage with the first engaging element to drive the housing to move along the matching direction, so that the pump inlet element and the loop outlet element are connected and matched, and the pump outlet element and the loop inlet element are connected and matched.

5. The coolant distribution unit (CDU) according to claim 3, wherein the first engaging element and the second engaging element are a fastening nut and a bolt matched with each other.

6. The coolant distribution unit (CDU) according to claim 3, wherein the guiding channel is formed by communicating through holes disposed on at least two blocks.

7. The coolant distribution unit (CDU) according to claim 2, wherein the loop inlet element and the loop outlet element face in a detaching direction opposite to the matching direction, wherein the second lateral wall faces toward the first lateral wall in the matching direction, and the first lateral wall faces toward the second lateral wall in the detaching direction.

8. The coolant distribution unit (CDU) according to claim 7, wherein the hot-swappable pump unit (HSPU) further comprises a handle extended along the detaching direction and disposed on the second lateral wall of the housing.

9. The coolant distribution unit (CDU) according to claim 1, wherein the hot-swappable pump unit (HSPU) further comprises an inlet adapter and an inlet pipe, and the pump inlet element is in communication with an inlet port of the pump through the inlet adapter and the inlet pipe, wherein the inlet pipe is accommodated in the accommodation space, and the inlet adapter is fixed to the first lateral wall and passes through the first lateral wall to connect to the inlet pipe.

10. The coolant distribution unit (CDU) according to claim 1, wherein the hot-swappable pump unit (HSPU) further comprises an outlet adapter, an outlet pipe and an elbow pipe, and the pump outlet element is in communication with an outlet port of the pump through the outlet adapter, the outlet pipe and the elbow pipe, wherein the outlet pipe and the elbow pipe are accommodated in the accommodation space, and the outlet adapter is fixed to the first lateral wall and passes through the first lateral wall to connect to the outlet pipe.

11. The coolant distribution unit (CDU) according to claim 1, wherein the pump inlet element and the loop outlet element are a quick male connector and a quick female connector matched to each other, respectively, and the pump outlet element and the loop inlet element are a quick female connector and a quick male connector matched to each other, respectively.

12. The coolant distribution unit (CDU) according to claim 1, wherein the hot-swappable pump unit (HSPU) further comprises a connection plug disposed on the first lateral wall and facing in the matching direction, wherein when the fastening component and the fixed component are engaged with each other, the connection plug is engaged and electrically connected to a connection socket of the coolant distribution unit (CDU).

13. The coolant distribution unit (CDU) according to claim 1, wherein the first lateral wall comprises a first opening, a second opening and a third opening, wherein the pump inlet element is in communication with the pump through the first opening, the pump outlet element is in communication with the pump through the second opening, and the fastening component is connected to the fixed component through the third opening, wherein the third opening is located between the first opening and the second opening in view of an upright direction of the first lateral wall.

14. A hot-swappable pump unit (HSPU) applied to a coolant distribution unit (CDU), and configured to connect to a loop inlet element, a loop outlet element and a fixed component of the coolant distribution unit (CDU) along a matching direction, wherein the hot-swappable pump unit (HSPU) comprises:
a housing comprising an accommodation space and a first lateral wall, wherein the loop inlet element and the loop outlet element are disposed on a backplate opposite to the first lateral wall, and the fixed component is arranged between the first lateral wall and the backplate;
a pump accommodated within the accommodation space;
a pump inlet element in communication with the pump by passing through the first lateral wall and configured to connect to the loop outlet element along the matching direction;
a pump outlet element in communication with the pump by passing through the first lateral wall and configured to connect to the loop inlet element along the matching direction; and
a fastening component disposed in the housing and configured to pass through the first lateral wall to engage with the fixed component, wherein when the fastening component and the fixed component are engaged with each other, the housing is driven to move along the matching direction, so that the pump inlet element and the loop outlet element are connected and matched, and the pump outlet element and the loop inlet element are connected and matched.

15. The hot-swappable pump unit (HSPU) according to claim 14, wherein the housing further comprises a second lateral wall opposite to the first lateral wall, the accommodation space is located between the first lateral wall and the second lateral wall, and the pump inlet element and the pump outlet element are disposed adjacent to the first lateral wall and face in the matching direction.

16. The hot-swappable pump unit (HSPU) according to claim 15, wherein the fixed component comprises a first engaging element, the fastening component comprises a second engaging element and a guiding channel, the guiding channel is passed through the first lateral wall and the second lateral wall along the matching direction, and the guiding channel is spatially corresponding to the first engaging element, wherein when the second engaging element passes through the second lateral wall, the guiding channel and the first lateral wall sequentially and is engaged with the first engaging element, the housing is driven to move along the matching direction, so that the pump inlet element and the loop outlet element are connected and matched, and the pump outlet element and the loop inlet element are connected and matched.

17. The hot-swappable pump unit (HSPU) according to claim 16, wherein the fixed component comprises a positioning aperture disposed adjacent to the first engaging element, and the hot-swappable pump unit (HSPU) further comprises a positioning pin disposed on the first lateral wall, extended along the matching direction, and spatially corresponding to the positioning aperture, wherein when the positioning pin is aligned to the positioning aperture and passes through the positioning aperture, the second engaging element is allowed to engage with the first engaging element to drive the housing to move along the matching direction, so that the pump inlet element and the loop outlet element are connected and matched, and the pump outlet element and the loop inlet element are connected and matched.

18. The hot-swappable pump unit (HSPU) according to claim 14, further comprising an inlet adapter and an inlet pipe, and the pump inlet element is in communication with an inlet port of the pump through the inlet adapter and the inlet pipe, wherein the inlet pipe is accommodated in the accommodation space, and the inlet adapter is fixed to the first lateral wall and passes through the first lateral wall to connect to the inlet pipe.

19. The hot-swappable pump unit (HSPU) according to claim 14, further comprising an outlet adapter, an outlet pipe and an elbow pipe, and the pump outlet element is in communication with an outlet port of the pump through the outlet adapter, the outlet pipe and the elbow pipe, wherein the outlet pipe and the elbow pipe are accommodated in the accommodation space, and the outlet adapter is fixed to the first lateral wall and passes through the first lateral wall to connect to the outlet pipe.

20. The hot-swappable pump unit (HSPU) according to claim 14, further comprising a connection plug disposed on the first lateral wall and facing in the matching direction, wherein when the fastening component and the fixed component are engaged with each other, the connection plug is engaged and electrically connected to a connection socket of the coolant distribution unit (CDU).

* * * * *